US009645631B2

United States Patent
Patil et al.

(10) Patent No.: US 9,645,631 B2
(45) Date of Patent: May 9, 2017

(54) OPTIMIZING POWER IN A MEMORY DEVICE

(71) Applicant: RAMBUS INC., Sunnyvale, CA (US)

(72) Inventors: Dinesh Patil, Sunnyvale, CA (US); Amir Amirkhany, Sunnyvale, CA (US); Farrukh Aquil, San Diego, CA (US); Kambiz Kaviani, Palo Alto, CA (US); Frederick A. Ware, Los Altos Hill, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/248,364

(22) Filed: Aug. 26, 2016

(65) Prior Publication Data
US 2017/0052584 A1 Feb. 23, 2017

Related U.S. Application Data

(63) Continuation of application No. 14/405,910, filed as application No. PCT/US2013/044934 on Jun. 10, 2013, now Pat. No. 9,431,089.

(60) Provisional application No. 61/658,709, filed on Jun. 12, 2012.

(51) Int. Cl.
| G11C 8/00 | (2006.01) |
| G06F 1/32 | (2006.01) |
| G11C 7/22 | (2006.01) |
| G11C 7/10 | (2006.01) |
| G06F 5/06 | (2006.01) |

(52) U.S. Cl.
CPC ............ *G06F 1/324* (2013.01); *G06F 1/3275* (2013.01); *G06F 1/3287* (2013.01); *G06F 5/065* (2013.01); *G11C 7/1057* (2013.01); *G11C 7/222* (2013.01); *G06F 2205/067* (2013.01)

(58) Field of Classification Search
CPC . G11C 11/4076; G11C 7/1057; G11C 7/1066; G11C 7/222; G11C 11/4093; G11C 7/04; G11C 2207/2272; H03L 7/0816
USPC ............. 365/233.1, 233.11, 233.12, 189.011
See application file for complete search history.

(56) References Cited

U.S. PATENT DOCUMENTS 9,001,597 B2 * 4/2015 Koshizuka ............... G11C 5/04
326/30

* cited by examiner

*Primary Examiner* — Fernando Hidalgo
(74) *Attorney, Agent, or Firm* — Lowenstein Sandler LLP

(57) ABSTRACT

Embodiments generally relate to a memory device. In one embodiment, the memory device includes a clock receiver circuit that receives an external clock signal and provides an internal clock signal. The memory device also includes a delay-locked loop circuit (DLL) having an input, and a circuit that receives the internal clock signal. The circuit selects which pulses of the internal clock signal are applied to the input of the DLL, such that no more than two clock pulses selected from at least three consecutive pulses of the external clock signal are applied to the input of the DLL during a predetermined interval. In another embodiment, a method includes receiving an external clock signal at a clock receiver circuit, receiving an internal clock signal from the clock receiver circuit, and selecting which pulses of the internal clock signal are applied to an input of a DLL, where no more than two clock pulses selected from at least three consecutive pulses of the external clock signal are applied to the input of the DLL during a predetermined interval.

20 Claims, 6 Drawing Sheets

OPTIMIZING POWER IN A MEMORY DEVICE

CROSS REFERENCE TO RELATED APPLICATIONS

This application is a Continuation of U.S. application Ser. No. 14/405,910, filed Dec. 5, 2014, which is US National Stage 371 Application of PCT Application No. PCT/US2013/044934, filed Jun. 10, 2013, which claims priority from U.S. Provisional Application No. 61/658,709 filed Jun. 12, 2012, all of which are hereby incorporated by reference as is set forth in full in this application for all purposes.

BACKGROUND

Computer systems such as servers typically employ many dynamic random access memory (DRAM) chips in order to have adequate memory capacity. Each of these DRAM chips has a delay-locked loop (DLL) that synchronizes the data output of the DRAM with an external clock at a clock input of the DRAM chip. Because only a few DRAM chips are accessed at any given time, a large number of DRAM chips are in idle mode. While unused DRAM chips can potentially turn off their DLLs to save power, their turn-on time would be significantly high due to the need for re-locking their DLLs. To avoid such latency, idling DRAMs usually keep their DLLs on.

BRIEF DESCRIPTION OF THE DRAWINGS

The various embodiments disclosed herein are illustrated by way of example and not by way of limitation in the figures of the accompanying drawings, in which like reference numerals refer to similar elements.

DETAILED DESCRIPTION

Embodiments described herein provide a memory device that includes a circuit that receives an internal clock signal and selects which pulses of the internal clock signal are applied to an input of a delay-locked loop circuit (DLL). The circuit selects clock pulses such that a subset of the clock pulses is applied to the input of the DLL during a predetermined interval. As described in more detail below, this optimizes operations of the DLL during an idle mode.

In various embodiments disclosed herein, a memory device includes a clock gating circuit, referred to as a command and address clock (CAclk) pulse swallower. The CAclk is used to sample the incoming data (DQ) eventually after DQS sampling, the command and address signals, and the CAclk is the input to the DLL. As described in more detail below, the CAclk pulse swallower modifies the operation of the DLL by performing a clock division of the CAclk to apply a reduced activity clock rCAclk to the input of the DLL when the memory device goes into an idle mode. In one embodiment, a reduced activity clock is a clock signal which is gated such that some of its transitions are masked. As a result, the DLL operates at a reduced activity clock, which reduces power consumption during the idle mode.

Figure 1:
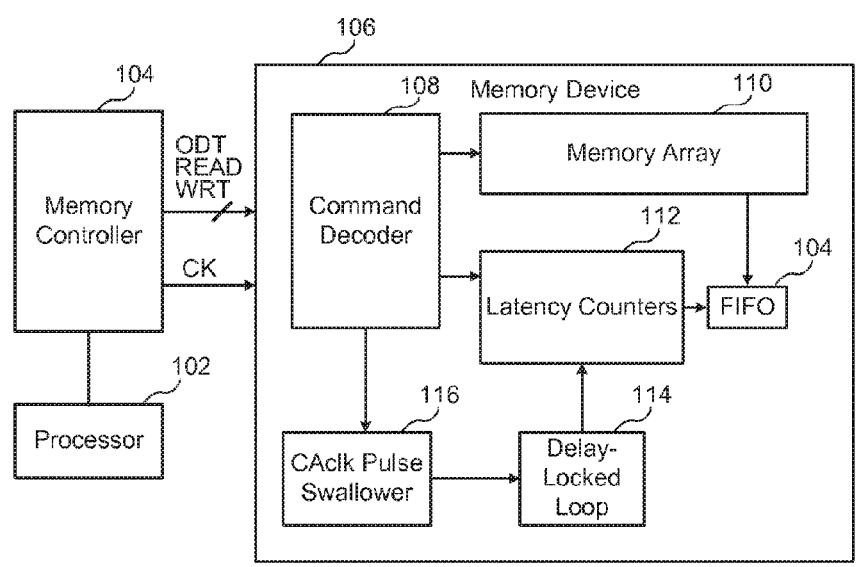
FIG. 1 illustrates a block diagram of an example environment, which may be used to implement the embodiments described herein.

FIG. 1 illustrates a block diagram of an example environment 100, which may be used to implement the embodiments described herein. As shown, a processor 102 is coupled to a memory controller 104, which is coupled to a memory device 106. Memory device 106 includes a command decoder 108, a memory array 110, latency counters 112, a DLL 114, and a CAclk pulse swallower 116.

Figure 2:
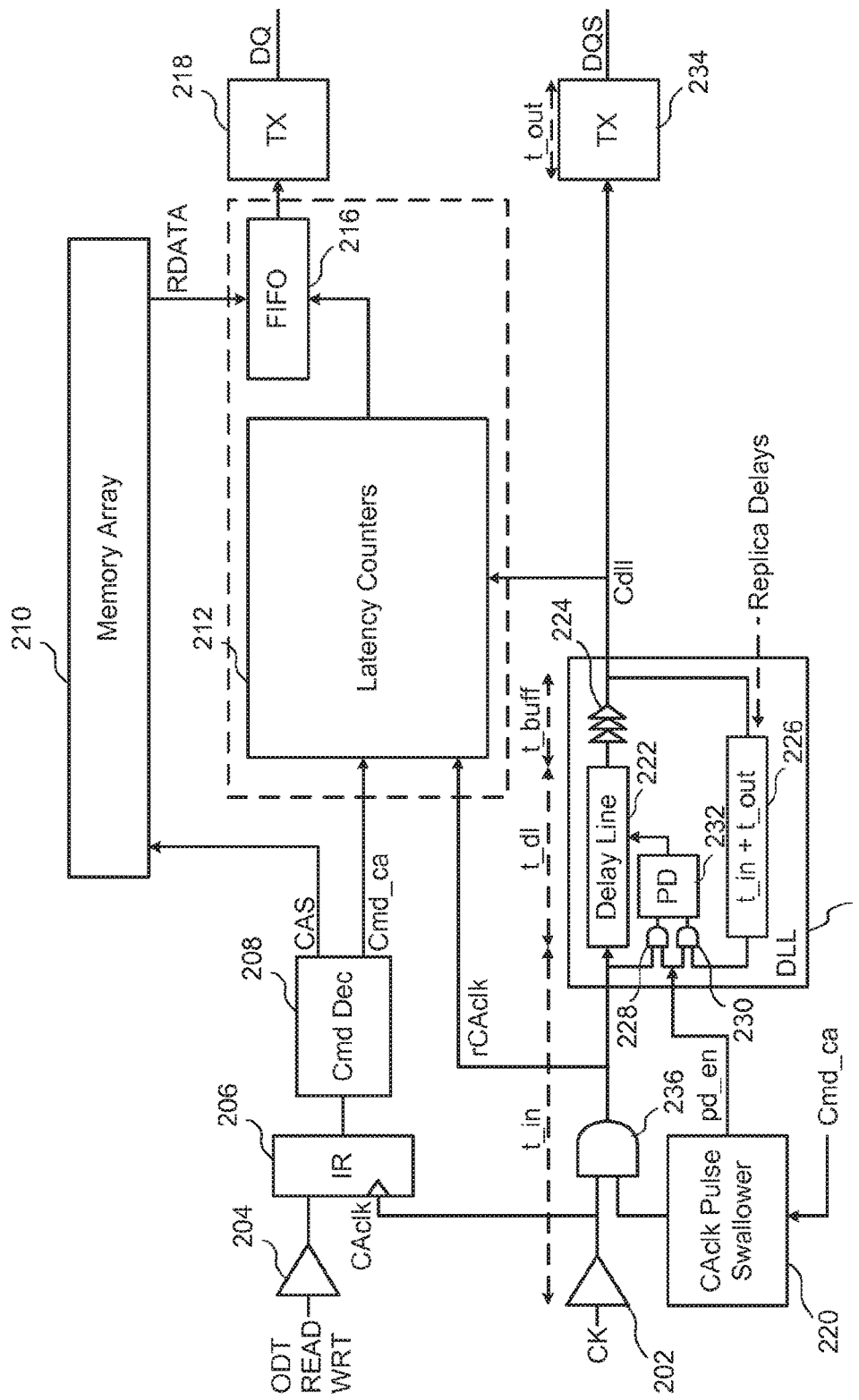
FIG. 2 illustrates a schematic diagram of an example memory device, according to one embodiment.

In some embodiments, environment 100 may not have all of the elements listed and/or may have other elements instead of, or in addition to, those listed above. For example, FIG. 2 shows a more detailed embodiment, which may also be used to implement embodiments described herein.

Memory controller 104 is an integrated circuit device that manages the flow of data signals DQ going to and from memory device 106. Memory controller 104 may be a chip with other integrated circuitry, microprocessor or application specific cores. In embodiments, memory controller 104 generates (e.g., using control logic) and outputs memory commands (Cmd), control signals, and a clock signal for memory device 106. Example signals may include an on-die-termination signal (ODT signal), a read command (READ), a write command (WRT), and an external clock signal, also referred to as clock CK. The control signals are synchronized to clock CK.

The ODT signal enables or changes terminations at the DQ pins of the DRAM in order to dampen reflections in the data lines.

DLL 114 synchronizes clock CK coming in to memory device 106 with the timing reference signal DQS (strobe signal) and data DQ being transmitted by memory device 106. DLL 114 ensures that the latency between clock CK and strobe signal is an integral number of cycles so that clock CK and the strobe signal are nominally edge aligned. It ensures that this latency remains constant throughout the operation of the memory device.

As described in more detail below in connection with FIGS. 2 and 3. CAclk pulse swallower 116 modifies the operation of DLL 114 in order to reduce power consumption when memory device 106 is in idle mode (e.g., stops receiving commands or control signals). In one or more embodiments, DLL 114 remains on even when memory device 106 is in idle mode. This enables DLL 114 to be available instantly and operate as needed as memory device 106 goes into active mode.

FIG. 2 illustrates a schematic diagram of an example memory device 200, according to an embodiment. As shown, memory device 200 includes an input buffer 202 that functions as a clock receiver circuit. Input buffer 202 receives an external clock signal, referred to as clock CK and amplifies it to generate an internal clock signal, referred to as clock CAclk. Input buffer 204 circuits may receive commands (e.g., READ command and WRT command) and/or control signals (e.g., ODT signal) from a memory controller, such as memory controller 104 of FIG. 1. An input register 206 receives the commands from input buffer 204, where the commands are registered synchronous with respect to CAclk. A command decoder (Cmd Dec) 208 receives the commands from input register (IR) 206 and then decodes them.

If a received command is a READ command, command decoder 208 sends an appropriate signal(s) to the memory array 210. It is shown as the column address strobe (CAS). Command decoder 208 also sends a trigger signal (Cmd ca) to the read latency counter 212. A DLL 214 also sends a clock Cdll to latency counters 212. In various embodiments, latency counters 212 may include a CAclk counter and Cdll counter (not shown). Example CAclk and Cdll counters are described in more detail below in connection with FIG. 5.

After a certain amount of time, the read data (RDATA) is sent to a first-in, first-out circuit (FIFO) 216. The amount of time required for memory access may vary, because the data delay from the core is asynchronous with respect to the Cdll, where the data delay is the column access time (tCAA). tCAA is the time from when the CAS signal is issued to memory array 210 to the time the data is valid at the input of FIFO 216. The data is ultimately sent from FIFO 216 to an output buffer (TX) 218, where the data is synchronized with clock Cdll provided by DLL 214. In one embodiment, clocks CAclk and Cdll do not have a phase relationship between each other.

In various embodiments, DLL 214 nominally aligns the phase of data output DQ and the output strobe signal at the output pins of memory device 200 to external clock CK at the input of memory device 200. In various embodiments, the entire delay from CK to DQS (tDQSCK) spans multiple CK clock cycles.

As described in more detail below, DLL 214 remains on during idle mode, and DLL 214 uses replica delays in order to ensure that DLL 214 can maintain the integral number of clock cycles between CK and DQS pins. As shown in FIG. 2, DLL 214 includes a delay line 222, buffers 224, t_in+ t_out replica delay path 226, gates 228 and 230, and phase detector (PD) 232. Buffers 224 couple to output buffer (TX) 234. In one embodiment, clock CAclk triggers input communication (e.g., triggers commands entering input register 206), and clock Cdll triggers output communication (e.g., triggers data leaving FIFO 216). In one embodiment, clock CAclk and clock Cdll are separated by the delay line (t dl) 222 plus clock distribution buffers (t_buff) 224. In one embodiment, gates 228 and 230 are AND gates.

In various embodiments, memory device 200 enters an idle mode when memory device 200 stops receiving commands (e.g., READ command and WRT command) or control signals (e.g., ODT signal) or as instructed by the controller. Generally. DLL 214 of memory device 200 consumes a significant amount of power when running at the same full frequency as clock CK.

To reduce power consumption in the idle mode, a clock gating circuit referred to as command address clock (CAclk) pulse swallower 220 reduces the activity of edges entering the DLL by applying a low-activity clock at the input of DLL 214 via gate 236. In one embodiment gate 236 is an AND gate, but may be any suitable gating circuit. In one embodiment. CAclk pulse swallower includes a finite state machine (FSM) that effectively and conditionally shapes clock CAclk into a low-activity clock to be applied to the input of DLL via gate 236. While embodiments are described in the context of CAclk pulse swallower, other types of clock dividers may be used. One embodiment of such a clock division is described in more detail below.

The low-activity clock pulses stream applied at the input of DLL 214 is referred to as reduced CAclk clock rCAclk. Applying rCAclk reduces activity in DLL 214 and thus reduces the amount of power consumption by DLL 214. As described in more detail below, when DLL 214 operates at the reduced activity of clock rCAclk while memory device is in idle mode, the frequency of clock rCAclk is sufficient for DLL 214 to properly track voltage and temperature changes in memory device 200.

If the rCAclk frequency is not the same as CK, the next highest frequency may be given by F/N, where F is the frequency of clock CK and N is tDQSCK measured in clock cycles of clock CK, and where tDQSCK is the time delay between clock CK and strobe signal. For example, in one embodiment, tDQSCK=t in+t dl+t buff+t out=4 tCK (here N=4). If the generated rCAclk is 50% duty cycle, then the DLL can compare the positive edge with the negative edge and the frequency of clock rCAclk can be reduced to F/(2N). This reduces the idle clock distribution power by a factor of 2N while allowing DLL 214 to instantly resume operation at the higher frequency of clock CK. This is possible because DLL 214 is always tracking the voltage and temperature changes of memory device 200 while in idle mode. Embodiments for providing a reduced clock rCAclk to DLL 214 are described in more detail below in connection of FIG. 3.

In some embodiments, environment 200 may not have all of the elements listed and/or may have other elements instead of, or in addition to, those listed above. For example FIG. 2 shows a more detailed embodiment, which may also be used to implement embodiments described herein.

Figure 3:
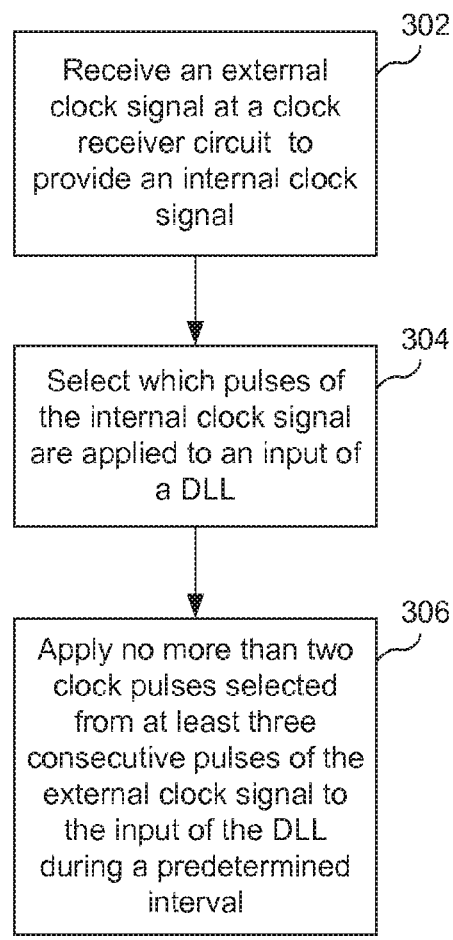
FIG. 3 illustrates an example simplified flow diagram for optimizing power in a memory device, according to one embodiment.

FIG. 3 illustrates an example simplified flow diagram for optimizing power in a memory device, according to one embodiment. Referring to both FIGS. 2 and 3, a process for optimizing power is initiated in block 302, where clock receiver circuit or input buffer 204 of memory device 200 receives external clock CK to provide an internal clock signal. A gate such as gate 236 of memory device 200 then receives the internal clock CAclk from input buffer 204. In block 304, CAclk pulse swallower 220 of memory device 200 selects which pulses of internal clock CAclk are applied to the input of DLL 214. In block 306, CAclk pulse swallower 220 applies no more than two clock pulses selected from at least three consecutive pulses of the external clock signal to the input of DLL 214 during a predetermined interval. In various embodiments described below, CAclk pulse swallower 220 shapes clock CAclk to produce clock rCAclk.

In one or more embodiments, CAclk pulse swallower 220 provides the two clock pulses to DLL 214 by gating internal clock CAclk when memory device 200 is in an idle mode. In various embodiments, memory device 200 is in an idle state when instructed by the controller or if the memory device 200 stops receiving command signals after a predetermined time period (e.g., after one clock cycle). Once CAclk pulse swallower 220 detects the idle mode. CAclk pulse swallower 220 generates the clock pulses of reduced clock rCAclk.

Input clock CAclk may be described in terms of pulses or edges. In one embodiment, CAclk pulse swallower 220 may shape input clock CAclk to provide a pair of edges to inputs of phase detector 232 after a first edge of the pair of edges propagates through delay line 222 of DLL 214. In various embodiments, the pair of edges may be leading edges or trailing edges, as long as the pair of edges is the same (e.g., both leading edges or both trailing edges).

In one embodiment, when CAclk pulse swallower 220 releases the first edge of the pair of edges, the first edge enters both delay line 222 and a gate 228. When CAclk pulse swallower 220 releases the first edge. CAclk pulse swallower 220 also disables phase detector 232 (by toggling pd_en). In one embodiment. CAclk pulse swallower 220 disables phase detector 232 by disabling gates 228 and 230, which prevents the first edge from entering phase detector 232. As described below, phase detector 232 triggers after receiving the second edge.

The first edge travels through delay line 222, buffers 224, and t_in+t_out replica delay path 226 before entering gate 230. After the first edge comes around and enters AND gate 230. CAclk pulse swallower 220 releases the second edge and also enables phase detector 232 (by toggling pd_en), which enables the first edge to enter phase detector 232.

The second edge travels through delay line 222, buffers 224, and t in+t out replica delay path 226 before entering gate 230. Still enabled phase detector 232 receives the second edge, determines the timing difference between the first and second edges, and provides an update.

CAclk pulse swallower 220 then disables phase detector 232 again (by toggling pd_en). This prevents new edges from entering phase detector 232 until CAclk pulse swallower 220 again enables phase detector 232. This process starts over when CAclk pulse swallower 220 releases another first edge of a pair of edges. By this gating of clock CA. CAclk pulse swallower 220 effectively swallows pulses, which provides reduced clock rCAclk.

As described above, CAclk pulse swallower 220 selects which pulses of clock CK (or clock CA) to apply to the input of DLL 214, CAclk pulse swallower 220 then divides clock CAclk to provide reduced clock rCAclk such that the two edge in a pair of edges going to the phase detector are away from each other by the tCKDQS time interval, and each pair of edges is away from each other by more than tCKDQS delay.

In one embodiment, when CAclk pulse swallower 220 selects and releases pairs of edges, CAclk pulse swallower 220 may propagate both edges (or pulses) through DLL 214 as described in the example embodiments above. In another embodiment. CAclk pulse swallower 220 may propagate one edge (or pulse) but not the second edge (or pulse) through DLL 214. Instead of sending the second edge through DLL 214. CAclk pulse swallower 220 may simply send the second edge to phase detector 232 for comparison with the first edge. In other words, the second edge may or may not propagate through DLL 214, depending on the specific implemented embodiment.

In one embodiment, in order to send the second edge to phase detector 232 and bypass delay line 222, buffers 224, and t_in+t_out replica delay path 226 of DLL 214. CAclk pulse swallower 220 may send the first and second edges through a multiplexor (MUX), where one MUX output sends the first edge through delay line 222, buffers 224, and t_in+t_out replica delay path 226 of DLL 214, and where the other MUX output sends the second edge to phase detector 232. In one embodiment, the MUX may replace gate 236. In another embodiment, the MUX may be added to gate 230 (e.g., following gate 236 in series, etc.).

In one embodiment, CAclk pulse swallower 220 starts gating clock CAclk and stops gating clock CAclk based on input commands (cmd ca). For example, in one embodiment, when the memory device enters idle mode, CAclk pulse swallower 220 is activated immediately. When memory device 200 receives an input command or signal (e.g., ODT signal. READ command, or WRT command) and goes into an active mode, within one cycle from the command being decoded by command decoder, CAclk pulse swallower 200 stops gating clock CAclk and applies the full-frequency clock CAclk to the input of DLL 214. This immediately activates DLL 214. During these cycles between active and idle mode of memory 200, latency counters 212 are unaware of the modification of the behavior of DLL 214, which enables latency counters 212 to operate as normal.

Figure 4:
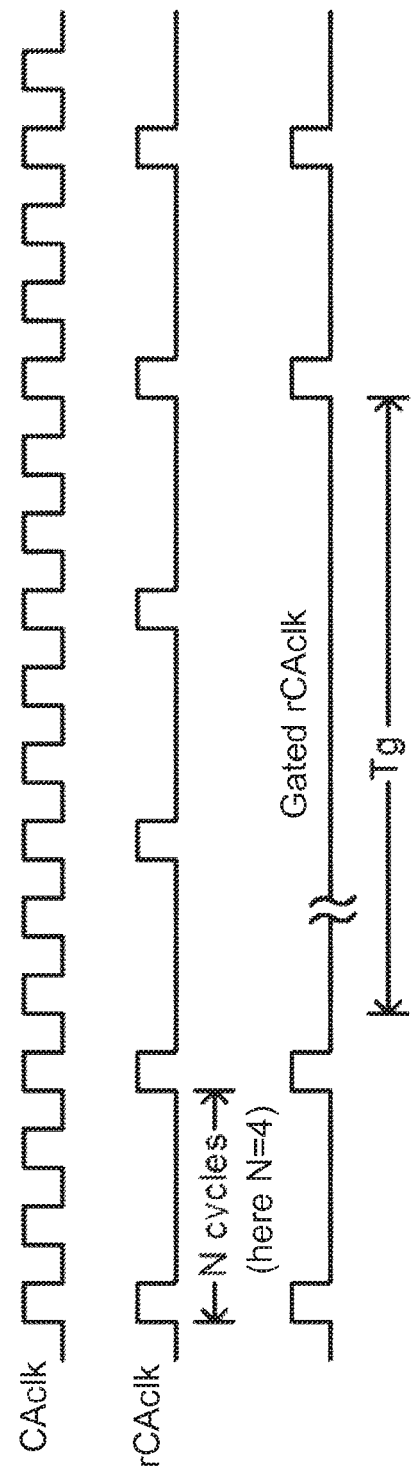
FIG. 4 shows a timing diagram of signals associated with the operation of a memory device, according to one embodiment.

FIG. 4 shows a timing diagram of signals associated with the operation of a memory device 200, according to one embodiment. FIG. 4 shows clock CAclk, and two versions of reduced clock rCAclk during the idle mode. As shown, in one embodiment. CAclk pulse swallower 220 gates clock CAclk to separate repeating pairs of edges by a predetermined time period that is greater than a delay line of DLL 214. As described above, CAclk pulse swallower 220 then applies resulting clock rCAclk to the input of DLL 214 during idle mode.

In one embodiment, the transition into and out of the reduced clock mode may be triggered by signals that indicate the change of the memory device mode (e.g., Cmd signals).

In one embodiment, the division ratio N is determined during initial calibration of memory device 200. N is the distance between clock CK and strobe signal. In one embodiment. CAclk pulse swallower 220 sends pulses that are separated by N. In one embodiment, after DLL 214 reaches a locked state, the DLL control code is frozen and CAclk pulse swallower 220 produces clock pulses pairs with a large time gap, or period Tg. As shown, period Tg is the gap between two sets of pairs, and period Tg may be programmed. In one embodiment, the period Tg is set according to DLL requirements for tracking voltage and temperature variations of memory device 200 that is expected. In various embodiments, the power savings is proportional to the period Tg. For example, a larger gap Tg results in a larger power savings.

In one embodiment, to determine N after the initial calibration, each time an edge (e.g., the positive edge) of a released pulse enters DLL 214, the edge also starts a counter inside CAclk pulse swallower 220, and the counter counts the clock pulses. The edge travels through DLL 214 and returns through t in+t out replica delay path 226. Upon returning, the edge stops the counter, and that count equals N, which is the measure of tDQSCK in the number of clock cycles of clock CK.

The voltage and temperature variation occurs at a slow rate, and DLL 214 thus requires updates less often. In one embodiment. CAclk pulse swallower 220 uses this property to periodically send a group of rCAclk pulses. In some implementations, the period Tg may be as long as 10us and is specified during the initial calibration. The counter in CAclk pulse swallower 220 counts the number of clock periods before sending a set of rCAclk pulses.

In one embodiment, each pair of edges provides an update to DLL 214 in that phase detector 232 determines from the time difference between the edges of a pair whether to maintain, increase, or decrease the delay. CAclk pulse swallower 220 may send pairs of edges at any predetermined time to provide another update, and the frequency of updates will depend on the particular implementation. As indicated above. N is the CK-to-DQS latency number of clock cycles, which is known from initial calibration of memory device 220. DLL 214 gets updated sufficiently so as to properly track the voltage and temperature changes with more fidelity.

In one embodiment, CAclk pulse swallower 220 includes a programmable timer, where the programmable timer generates a clock output signal that has a predetermined frequency sufficient to enable DLL 214 to track voltage and temperature changes with a predetermined degree of accuracy.

In various embodiments, DLL 214 remains on even while memory device 200 is in idle mode so that DLL 214 continually maintains phase relationship between clock CK and strobe signal. DLL 214 remains on also in order to perform other operations such as voltage and temperature tracking, even when memory device is in idle mode and DLL 214 is not needed for memory operations. When memory device 200 is in idle mode, DLL continues tracking clock CK to compensate for voltage and temperature changes. However, clock rCAclk need not operate at the same full frequency of clock CK.

For example, in one example, assuming memory device 200 is operating at a low frequency (e.g., 400 MHz), in order to achieve an adequate power savings such as a 10× power savings), idle mode updates should be at least greater than 20 MHz in order adequately track changes in voltage and temperature. In normal operations, changes in voltage and temperature are slow enough such that idle mode updates of at least 20 MHz are sufficient for tracking. The actual reduced clock rate is programmable and will depend on the specific implementation.

Figure 5:
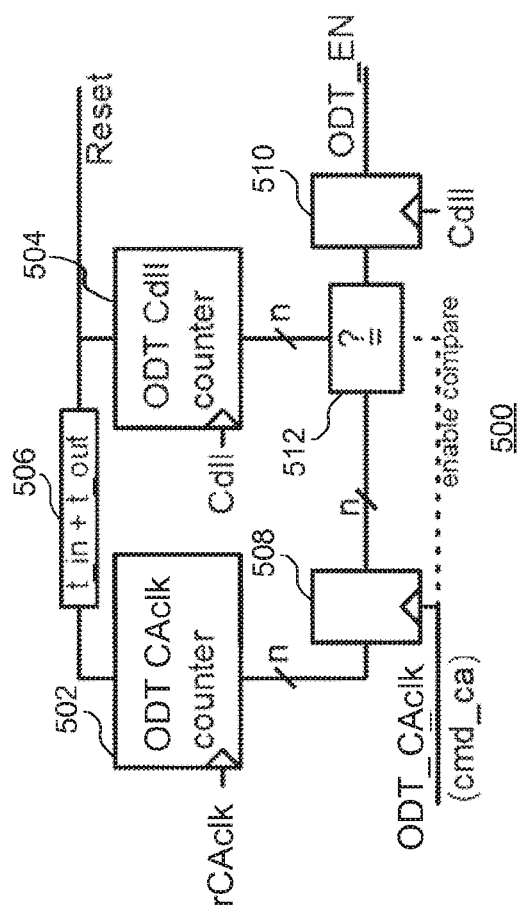
FIG. 5 illustrates an example simplified block diagram of latency counters, according to one embodiment.

FIG. 5 illustrates an example simplified block diagram of latency counters 500, according to one embodiment. For ease of illustration, ODT latency counters are described in the example embodiments. In other embodiments, READ latency counters may have the same or similar architecture as the ODT counters shown in FIG. 5.

The periodic gating and ungating of clock CAclk does not disrupt the relationship between ODT CAclk counter 502 and ODT Cdll counter 504. The output of CAclk pulse swallower 220 (reduced clock rCAclk) clocks ODT CAclk counter 502. No readjustment of ODT CAclk counter 502 and ODT Cdll counter 504 is required after the initial calibration.

Clock Cdll clocks register 510, which sends data to the output buffer 218 (shown in FIG. 2).

In various scenarios, ODT CAclk counter 502 and ODT Cdll counter 504 may go out of sync while the memory device enters an idle state. For example, ODT Cdll counter 504 gets extra trailing edges after ODT CAclk counter 502 stops. ODT CAclk counter 502 and ODT Cdll counter 504 get back into sync when memory device 200 exits the idle mode. For example ODT CAclk counter 502 starts counting before ODT Cdll counter 504 receives edges of clock Cdll. In other words, if CAclk pulse swallower 220 gates Cdll, CAclk pulse swallower 220 also gates clock CAclk. Accordingly, rCAclk and Cdll stay in sync. Latency counters assume constant CAclk and Cdll.

In various embodiments, connecting the reduced clock rCAclk directly to the latency counter 212 (specifically, to ODT CAclk counter 502) avoids disruption of the ODT CAclk counter 502 and ODT Cdll counter 504.

Figure 6:
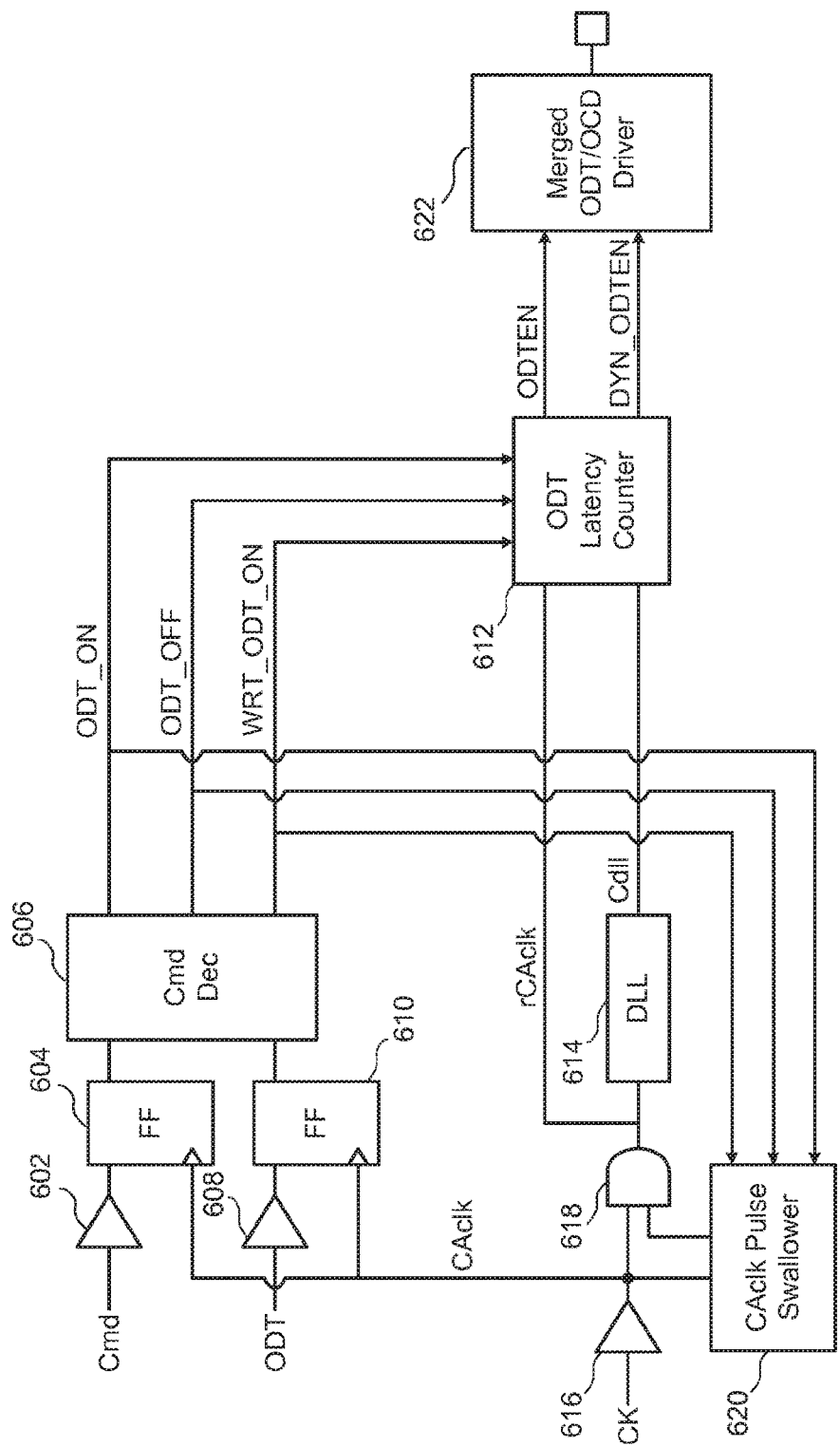
FIG. 6 illustrates an example simplified block diagram of a memory device having a dynamic on-die-termination (ODT) latency counter, according to one embodiment.

FIG. 6 illustrates an example simplified block diagram of a memory device having a dynamic ODT latency counter 600, according to one embodiment. FIG. 6 shows an input buffer 602 that receives a command signal (Cmd), a flip-flop register (FF) 604 that receives the command signal, and a command decoder 606 that decodes the command signal. An input buffer 608 receives an ODT signal, an FF 610 receives the ODT signal, and command decoder 606 decodes the ODT signal. FIG. 6 also shows an ODT latency counter 612 and a DLL 614. An input buffer 616 receives an external clock CK, which is fed to FFs 604 and 610, and to a gate 618. In one embodiment, gate 618 is an AND gate. A CAclk pulse swallower 620 gates internal clock CAclk to provide a reduced clock rCAclk to DLL 614. FIG. 6 also shows a merged ODT/OCD driver.

As described in more detail below, embodiments described herein support dynamic ODT. In one embodiment, the ODT at the DQ pins may be dynamically changed at a number of clock cycles after the ODT pin is asserted. In one embodiment, an appropriate assertion of the output (ODT ON. ODT OFF. WRT ODT ON, etc.) of a command decoder triggers the end of the CAclk pulse swallowing, which enables the full-rate frequency of the internal clock CAclk to go through DLL 614.

In various embodiments, it is assumed that command decoder 606 completes an appropriate assertion of the output within one clock cycle so that CAclk pulse swallower 620 can release clock CAclk starting at the next cycle. While ODT Cdll counter 504 (FIG. 5) does not resume counting until a delay of DLL+buffer, after clock CAclk reaches ODT CAclk counter 502 (FIG. 5), ODT Cdll counter 504 also continues to count for a period of DLL+buffer longer than ODT CAclk counter 502 when memory device 800 enters the idle mode. Accordingly, the relationship between ODT CAclk counter 502 and ODT Cdll counter 504 is continually restored as memory device 200 cycles between idle mode to active mode. In addition, during idle mode, both of the counters ODT CAclk counter 502 and ODT Cdll counter 504 continue counting at slower rate, and they maintain their offset intact. In other words, whether memory device is in idle mode or active mode. ODT CAclk counter 502 and ODT Cdll counter 504 count the same number edges.

If the latency that the counters need to count should be larger than the amount by which the counters go out of sync, the counter relationship will be restored before the count value of ODT Cdll counter 504 needs to be compared with the count value captured from ODT CAclk counter 502.

Embodiments described herein also apply to the read latency counters. For example, in one embodiment, the read latency counters are also clocked with rCAclk. Because the read latency is typically much longer than the ODT latency, the read path is not a cause for concern.

Embodiments described herein provide various benefits. For example, embodiments accommodate other functions of a memory device 106. For example, the memory device may continue keeping track of READ latency. ODT timing, etc. during idle mode. Embodiments are also minimally invasive to the existing architecture of a memory device. Embodiments may be applied to conventional DLLs and the DLLs are immediately available when needed.

Embodiments also provide optimization of power in a memory device in a manner that is seamless to a memory controller.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and very-high-speed IC hardware description language (VHDL), formats supporting register level description languages like register transfer language (RTL), and formats supporting geometry description languages such as graphic database system II stream format (GDSII), GDSIII, GDSIV. Caltech intermediate form (CIF), manufacturing electron-beam exposure system (MEBES) and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. An address or other value provided "in" or "with" a command may be transmitted concurrently (i.e., at least partly overlapping in time) with a group of bits containing a command code or identifier, or prepended, appended or otherwise transmitted in association with the command code or identifier. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A memory device comprising:
   a first circuit to receive an external clock signal and generate a reduced clock signal, such that, during a given interval, a number of pulses of the reduced clock is less than a number of pulses of the external clock signal;
   a delay-locked loop (DLL) circuit to receive the reduced clock signal as an input and generate a second clock signal based on the reduced clock signal;
   a first latency counter clocked by the reduced clock signal; and
   a second latency counter clocked by the second clock signal, wherein the first and second latency counters to indicate a time for outputting data from the memory device relative to a received read command.

2. The memory device of claim 1, further comprising:
   an input buffer to receive the read command and to receive a first mode command from a memory controller, the first mode command to cause the memory device to enter an idle mode.

3. The memory device of claim 2, wherein responsive to the memory device entering the idle mode, the second latency counter to receive one or more edges of the second clock signal after the first latency counter stops counting.

4. The memory device of claim 2, wherein the input buffer to further receive a second mode command from the memory controller, the second mode command to cause the memory device to exit the idle mode.

5. The memory device of claim 4, wherein responsive to the memory device exiting the idle mode, the first latency counter to receive one or more edges of the reduced clock signal before the second latency counter starts counting.

6. The memory device of claim 1, wherein the DLL circuit to delay the second clock signal with respect to the reduced clock signal to synchronize the first latency counter and the second latency counter when the memory device exits an idle mode.

7. The memory device of claim 1, wherein the reduced clock signal comprises no more than two pulses selected from at least three consecutive pulses of the external clock signal during the given interval.

8. A method of operation in a memory device, the method comprising:
   receiving, by a first circuit, an external clock signal and generating a reduced clock signal, such that, during a given interval, a number of pulses of the reduced clock is less than a number of pulses of the external clock signal;
   receiving, by a delay-locked loop (DLL) circuit, the reduced clock signal as an input and generating a second clock signal based on the reduced clock signal;
   clocking a first latency counter by the reduced clock signal; and
   clocking a second latency counter by the second clock signal, wherein the first and second latency counters to indicate a time for outputting data from the memory device relative to a received read command.

9. The method of claim 8, further comprising:
   receiving, by an input buffer, the read command and a first mode command from a memory controller, the first mode command to cause the memory device to enter an idle mode.

10. The method of claim 9, further comprising:
responsive to the memory device entering the idle mode, receiving, by the second latency counter, one or more edges of the second clock signal after the first latency counter stops counting.

11. The method of claim 9, further comprising:
receiving, by the input buffer, a second mode command from the memory controller, the second mode command to cause the memory device to exit the idle mode.

12. The method of claim 11, further comprising:
responsive to the memory device exiting the idle mode, receiving, by the first latency counter, one or more edges of the reduced clock signal before the second latency counter starts counting.

13. The method of claim 8, further comprising:
delaying, by the DLL circuit, the second clock signal with respect to the reduced clock signal to synchronize the first latency counter and the second latency counter when the memory device exits an idle mode.

14. The method of claim 8,
wherein the reduced clock signal comprises no more than two pulses selected from at least three consecutive pulses of the external clock signal during the given interval.

15. A system comprising:
a memory controller; and
a memory device coupled to the memory controller, the memory device comprising:
  a first circuit to receive an external clock signal and generate a reduced clock signal, such that, during a given interval, a number of pulses of the reduced clock is less than a number of pulses of the external clock signal;
  a delay-locked loop (DLL) circuit to receive the reduced clock signal as an input and generate a second clock signal based on the reduced clock signal;
  a first latency counter clocked by the reduced clock signal; and
  a second latency counter clocked by the second clock signal, wherein the first and second latency counters to indicate a time for outputting data from the memory device relative to a received read command.

16. The system of claim 15, wherein the memory device further comprises:
an input buffer to receive the read command and to receive a first mode command and a second mode command from the memory controller, the first mode command to cause the memory device to enter an idle mode and the second mode command to cause the memory device to exit the idle mode.

17. The system of claim 16, wherein responsive to the memory device entering the idle mode, the second latency counter to receive one or more edges of the second clock signal after the first latency counter stops counting.

18. The system of claim 16, wherein responsive to the memory device exiting the idle mode, the first latency counter to receive one or more edges of the reduced clock signal before the second latency counter starts counting.

19. The system of claim 16, wherein the DLL circuit to delay the second clock signal with respect to the reduced clock signal to synchronize the first latency counter and the second latency counter when the memory device exits the idle state.

20. The system of claim 15, wherein the reduced clock signal comprises no more than two clock pulses selected from at least three consecutive pulses of the external clock signal during the given interval.

* * * * *